(12) United States Patent
Li et al.

(10) Patent No.: US 12,453,093 B2
(45) Date of Patent: Oct. 21, 2025

(54) MEMORY CIRCUITRY AND METHOD USED IN FORMING MEMORY CIRCUITRY

(71) Applicant: Micron Technology, Inc., Boise, ID (US)

(72) Inventors: Andrew Li, Boise, ID (US); Sidhartha Gupta, Boise, ID (US); Adam W. Saxler, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 559 days.

(21) Appl. No.: 17/948,521

(22) Filed: Sep. 20, 2022

(65) Prior Publication Data

US 2024/0098993 A1    Mar. 21, 2024

(51) Int. Cl.
| | | |
|---|---|---|
| H01L 27/11582 | (2017.01) | |
| H10B 41/27 | (2023.01) | |
| H10B 43/27 | (2023.01) | |

(52) U.S. Cl.
CPC ............. *H10B 43/27* (2023.02); *H10B 41/27* (2023.02)

(58) Field of Classification Search
CPC ......... H10B 41/27; H10B 43/10; H10B 43/27
See application file for complete search history.

(56) References Cited

U.S. PATENT DOCUMENTS

| | | | | |
|---|---|---|---|---|
| 2021/0358929 A1* | 11/2021 | Hopkins | ................. | H10B 43/27 |
| 2021/0358930 A1* | 11/2021 | Hopkins | ................. | H10B 41/10 |
| 2021/0358939 A1* | 11/2021 | Hopkins | ................. | H10B 41/10 |
| 2022/0149066 A1* | 5/2022 | Hopkins | ................. | H10B 43/10 |

OTHER PUBLICATIONS

U.S. Appl. No. 17/409,300, filed Aug. 23, 2021, by Scarbrough et al.
U.S. Appl. No. 17/409,355, filed Aug. 23, 2021, by Scarbrough et al.
U.S. Appl. No. 17/508,143, filed Oct. 22, 2021, by Scarbrough et al.

* cited by examiner

*Primary Examiner* — Jaehwan Oh
(74) *Attorney, Agent, or Firm* — Wells St. John P.S.

(57) ABSTRACT

A memory array comprising strings of memory cells comprises laterally-spaced memory blocks individually comprising a vertical stack comprising alternating insulative tiers and conductive tiers above a conductor tier. Strings of memory cells comprise channel-material strings that extend through the insulative tiers and the conductive tiers in the memory blocks. The channel-material strings directly electrically couple to conductor material of the conductor tier. Intervening material is laterally-between and longitudinally-along immediately-laterally-adjacent of the memory blocks. The intervening material comprises a laterally-outer insulative lining extending longitudinally-along the immediately-laterally-adjacent memory-blocks. The laterally-outer insulative lining has its lowest surface between a top and a bottom of the lowest conductive tier. The laterally-outer insulative lining has its highest surface at or below a lowest surface of the next-lowest conductive tier. Laterally-inner insulating material extends longitudinally-along the immediately-laterally-adjacent memory blocks laterally-inward of the laterally-outer insulative lining. An interface is between the laterally-outer insulative lining and the laterally-inner insulating material. Methods are also disclosed.

36 Claims, 20 Drawing Sheets

MEMORY CIRCUITRY AND METHOD USED IN FORMING MEMORY CIRCUITRY

TECHNICAL FIELD

Embodiments disclosed herein pertain to memory circuitry and to methods used in forming memory circuitry.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Flash memory is one type of memory and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured in a three-dimensional arrangement comprising vertically-stacked memory cells individually comprising a reversibly programmable vertical transistor. Control or other circuitry may be formed below the vertically-stacked memory cells. Other volatile or non-volatile memory array architectures may also comprise vertically-stacked memory cells that individually comprise a transistor.

Memory arrays may be arranged in memory pages, memory blocks and partial blocks (e.g., sub-blocks), and memory planes, for example as shown and described in any of U.S. Patent Application Publication Nos. 2015/0228651, 2016/0267984, and 2017/0140833. The memory blocks may at least in part define longitudinal outlines of individual wordlines in individual wordline tiers of vertically-stacked memory cells. Connections to these wordlines may occur in a so-called "stair-step structure" at an end or edge of an array of the vertically-stacked memory cells. The stair-step structure includes individual "stairs" (alternately termed "steps" or "stair-steps") that define contact regions of the individual wordlines upon which elevationally-extending conductive vias contact to provide electrical access to the wordlines.

DETAILED DESCRIPTION OF EXAMPLE EMBODIMENTS

Figure 1:
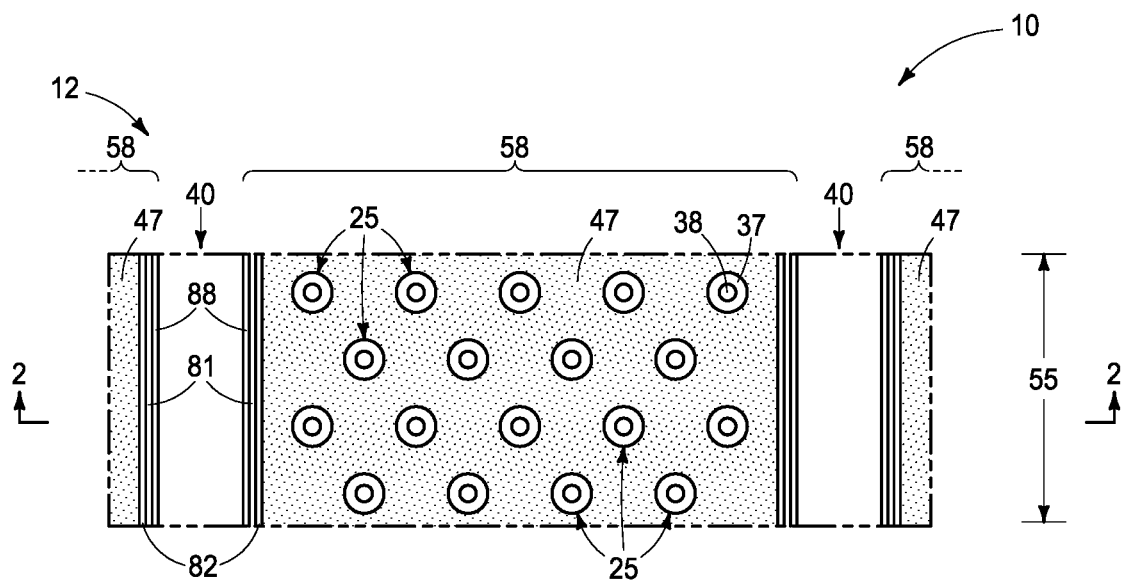
FIGS. 1-4 are diagrammatic cross-sectional views of portions of a construction that will comprise an array of elevationally-extending strings of memory cells in accordance with an embodiment of the invention.
Figure 2:
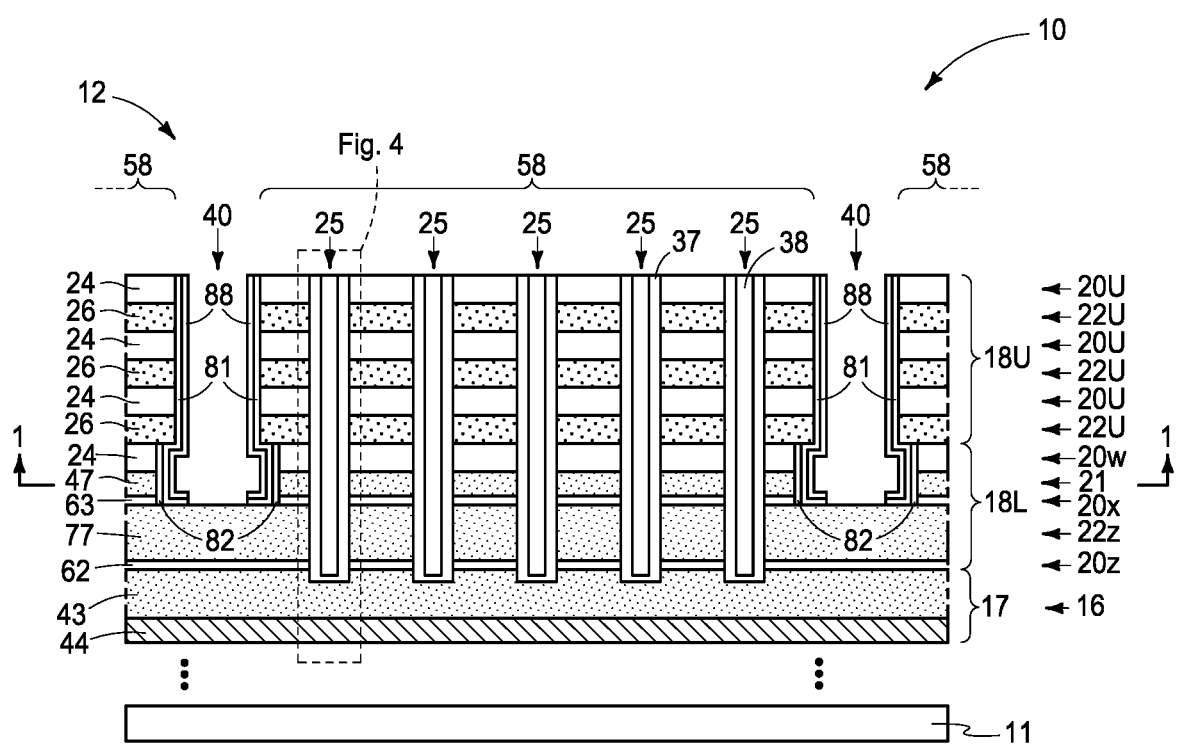
Figure 3:
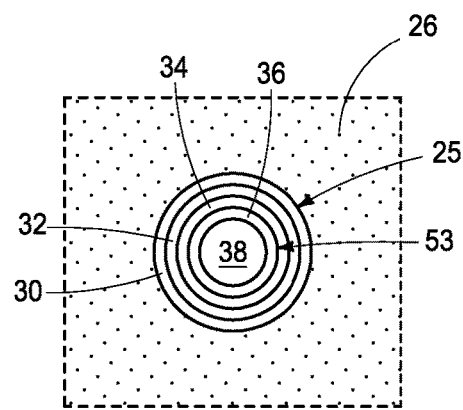
Figure 4:
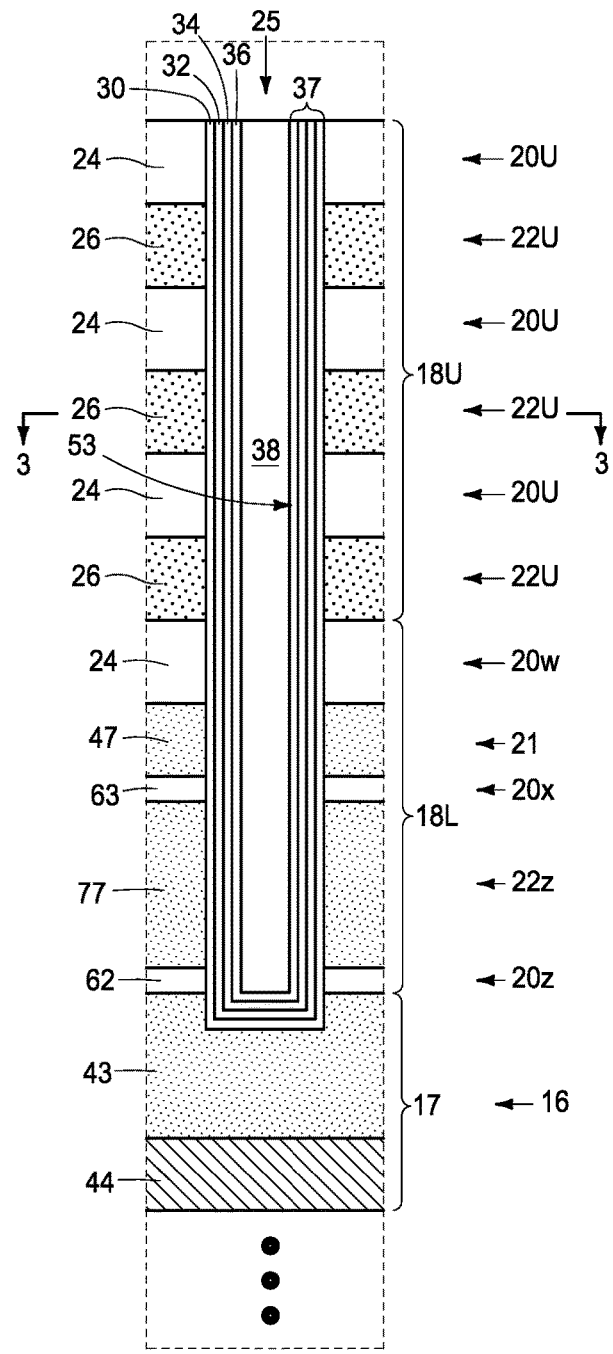

Embodiments of the invention encompass methods used in forming integrated circuitry, for example memory circuitry comprising a memory array, for example an array of NAND or other memory cells that may have at least some peripheral control circuitry under the array (e.g., CMOS-under-array). Embodiments of the invention encompass so-called "gate-last" or "replacement-gate" processing, so-called "gate-first" processing, and other processing whether existing or future-developed independent of when transistor gates are formed. Embodiments of the invention also encompass integrated circuitry such as that comprising a memory array comprising strings of memory cells (e.g., NAND architecture) independent of method of manufacture. Some example embodiments are described with reference to FIGS. 1-28.

FIGS. 1-4 show an example construction 10 having an array 12 in which elevationally-extending strings of transistors and/or memory cells will be formed. Such includes a base substrate 11 having any one or more of conductive/conductor/conducting, semiconductive/semiconductor/semiconducting, or insulative/insulator/insulating (i.e., electrically herein) materials. Various materials have been formed elevationally over base substrate 11. Materials may be aside, elevationally inward, or elevationally outward of the FIGS. 1-4—depicted materials. For example, other partially or wholly fabricated components of integrated circuitry may be provided somewhere above, about, or within base substrate 11. Control and/or other peripheral circuitry for operating components within an array (e.g., array 12) of elevationally-extending strings of memory cells may also be fabricated and may or may not be wholly or partially within an array or sub-array. Further, multiple sub-arrays may also be fabricated and operated independently, in tandem, or otherwise relative one another. In this document, a "sub-array" may also be considered as an array.

A conductor tier 16 comprising conductor material 17 has been formed above substrate 11. Example conductor material 17 comprises upper conductor material 43 directly above and directly electrically coupled to (e.g., directly against) lower conductor material 44 of different composition from upper conductor material 43. An example upper conductor material 43 comprises conductively-doped semiconductive material (e.g., n-type-doped or p-type-doped polysilicon) and an example lower conductor material 44 comprises metal material (e.g., a metal silicide such as $WSi_x$). Conductor tier 16 may comprise part of control circuitry (e.g., peripheral-under-array circuitry and/or a common source line or plate) used to control read and write access to the transistors and/or memory cells that will be formed within array 12.

A lower portion 18L of a stack 18* has been formed above substrate 11 and conductor tier 16 (an * being used as a suffix to be inclusive of all such same-numerically-designated components that may or may not have other suffixes). Stack 18* will comprise vertically-alternating conductive tiers 22* and insulative tiers 20*, with material of tiers 22* being of different composition from material of tiers 20*. Stack 18* comprises laterally-spaced memory-block regions 58 that will comprise laterally-spaced memory blocks 58 in a finished-circuitry construction. In this document, unless otherwise indicated, "block" is generic to include "sub-block". Memory-block regions 58 and resultant memory blocks 58 (not yet shown) may be considered as being longitudinally elongated and oriented, for example along a direction 55. Conductive tiers 22* (alternately referred to as first tiers) may not comprise conducting material and insulative tiers 20* (alternately referred to as second tiers) may not comprise insulative material or be insulative at this point in processing in conjunction with the hereby initially-described example method embodiment which is "gate-last" or "replacement-gate".

Example lower portion 18L comprises a lowest tier 20z of second tiers 20* directly above (e.g., directly against) conductor material 17. Example lowest second tier 20z is insulative and may be sacrificial (e.g., comprising material 62, for example silicon dioxide and/or silicon nitride). A next-lowest second tier 20x of second tiers 20* is directly above lowest second tier 20z and may be sacrificial (e.g., comprising material 63, for example silicon dioxide and/or silicon nitride). In some embodiments, a lowest tier 22z of first tiers 22* comprises sacrificial material 77 (e.g., polysilicon or silicon nitride) is vertically between lowest second tier 20z and next-lowest second tier 20x. Example lower portion 18L comprises a conducting-material tier 21 comprising conducting material 47 (e.g., conductively-doped polysilicon) that is directly above next-lowest second tier 20x. Example lower portion 18L comprises an upper second tier 20w (e.g., a next-next lowest second tier at least at this point of processing) comprising insulative material 24 (e.g., silicon dioxide). Additional tiers may be present. For example, one or more additional tiers may be above tier 20w (tier 20w thereby not being the uppermost tier in portion 18L, and not shown), between tier 20w and tier 21 (not shown), and/or below tier 22z (other than 20z not being shown).

Example stack 18* comprises an upper portion 18U comprising vertically-alternating first tiers 22U and second tiers 20U formed above lower portion 18L. Material 26 of first tiers 22U (e.g., silicon nitride) is sacrificial and of different composition from material 24 of second tiers 20U (e.g., silicon dioxide). First tiers 22U may be conductive and second tiers 20U may be insulative, yet need not be so at this point of processing in conjunction with the hereby initially-described example method embodiment which is "gate-last" or "replacement-gate". Example upper portion 18U is shown starting above lower portion 18L with a first tier 22U although such could alternately start with a second tier 20U (not shown). Further, and by way of example, lower portion 18L may be formed to have one or more first and/or second tiers as a top thereof. Regardless, only a small number of tiers 20U and 22U is shown, with more likely upper portion 18U (and thereby stack 18*) comprising dozens, a hundred or more, etc. of tiers 20* and 22*. Further, other circuitry that may or may not be part of peripheral and/or control circuitry may be between conductor tier 16 and stack 18*. By way of example only, multiple vertically-alternating tiers of conductive material and insulative material of such circuitry may be below a lowest of conductive tiers 22* and/or above an uppermost of conductive tiers 22*. For example, one or more select gate tiers (not shown) may be between conductor tier 16 and the lowest conductive tier 22* and one or more select gate tiers may be above an uppermost of conductive tiers 22*. Alternately or additionally, at least one of the depicted uppermost and lowest conductive tiers 22* may be a select gate tier.

Channel openings 25 have been formed (e.g., by etching) through second tiers 20* and first tiers 22* in upper portion 18U to lower portion 18L (e.g., at least to lowest first tier 22z) in memory-block regions 58. Channel openings 25 may taper radially-inward and/or radially-outward (not shown) moving deeper into stack 18. In some embodiments, channel openings 25 may go into conductor material 17 of conductor tier 16 as shown or may stop there-atop (not shown). Alternately, as an example, channel openings 25 may stop atop or within the lowest second tier 20z. A reason for extending channel openings 25 at least to conductor material 17 of conductor tier 16 is to provide an anchoring effect to material that is within channel openings 25.

Transistor channel material may be formed in the individual channel openings elevationally along the insulative tiers and the conductive tiers, thus comprising individual channel-material strings, which is directly electrically coupled with conductor material in the conductor tier. Individual memory cells of the example memory array being formed may comprise a gate region (e.g., a control-gate region) and a memory structure laterally-between the gate region and the channel material. In one such embodiment, the memory structure is formed to comprise a charge-blocking region, storage material (e.g., charge-storage material), and an insulative charge-passage material. The storage material (e.g., floating gate material such as doped or undoped silicon or charge-trapping material such as silicon nitride, metal dots, etc.) of the individual memory cells is elevationally along individual of the charge-blocking regions. The insulative charge-passage material (e.g., a band gap-engineered structure having nitrogen-containing material [e.g., silicon nitride] sandwiched between two insulator oxides [e.g., silicon dioxide]) is laterally-between the channel material and the storage material.

In one embodiment and as shown, charge-blocking material 30, storage material 32, and charge-passage material 34 have been formed in individual channel openings 25 elevationally along insulative tiers 20 and conductive tiers 22. Transistor materials 30, 32, and 34 (e.g., memory-cell materials) may be formed by, for example, deposition of respective thin layers thereof over stack 18* and within individual openings 25 followed by planarizing such back at least to a top surface of stack 18*.

Channel material 36 as a channel-material string 53 has also been formed in channel openings 25 elevationally along insulative tiers 20 and conductive tiers 22. Materials 30, 32, 34, and 36 are collectively shown as and only designated as material 37 in some figures due to scale. Example channel materials 36 include appropriately-doped crystalline semiconductor material, such as one or more silicon, germanium, and so-called III/V semiconductor materials (e.g., GaAs, InP, GaP, and GaN). Example thickness for each of materials 30, 32, 34, and 36 is 25 to 100 Angstroms. Punch etching may be conducted to remove materials 30, 32, and 34 from the bases of channel openings 25 (not shown) to expose conductor tier 16 such that channel material 36 is directly against conductor material 17 of conductor tier 16. Such punch etching may occur separately with respect to each of materials 30, 32, and 34 (as shown) or may occur with respect to only some (not shown). Alternately, and by way of example only, no punch etching may be conducted and channel material 36 may be directly electrically coupled to conductor material 17 of conductor tier 16 only by a separate conductive interconnect (not yet shown). Regardless, sacrificial etch-stop plugs (not shown) may be formed in lower portion 18L in horizontal locations where channel openings 25 will be prior to forming upper portion 18U. Channel openings 25 may then be formed by etching materials 24 and 26 to stop on or within the material of the sacrificial plugs, followed by exhuming remaining material of such plugs prior to forming material in channel openings 25. A radially-central solid dielectric material 38 (e.g., spin-on-dielectric, silicon dioxide, and/or silicon nitride) is shown in channel openings 25. Alternately, and by way of example only, the radially-central portion within channel openings 25 may include void space(s) (not shown) and/or be devoid of solid material (not shown).

Horizontally-elongated trenches 40 have been formed (e.g., by anisotropic etching) to extend through first tiers 22* and second tiers 20* in stack 18* and that are individually between immediately-laterally-adjacent memory-block regions 58. Trenches 40 individually extend through upper portion 18U to lowest first tier 22z and expose sacrificial material 77 therein. Trenches 40 may taper laterally-inward or laterally-outward moving deeper into stack 18* or otherwise be of varied width. A sacrificial etch-stop line (not shown) having the same general horizontal outline as individual trenches 40 may be formed in a lower portion of stack 18* prior to forming trenches 40 (e.g., in the example depicted wider lower portions of such trenches). Trenches 40 may then be formed by etching materials 24 and 26 to stop on or within the material of the individual sacrificial lines, followed by exhuming remaining material of such sacrificial lines.

By way of example and for brevity only, channel openings 25 are shown as being arranged in groups or columns of staggered rows of four and five channel openings 25 per row. Trenches 40 will typically be wider than channel openings 25 (e.g., 3 to 10 times wider). Any alternate existing or future-developed arrangement and construction may be used. Trenches 40 and channel openings 25 may be formed in any order relative the other or at the same time.

In one embodiment and as shown, an etch-stop lining 81 has been formed in horizontally-elongated trenches 40 and extends longitudinally-along immediately-laterally-adjacent memory-block regions 58. Etch-stop lining 81 comprises (e.g., consists essentially of) a doped silicon nitride having dopant therein at a total atomic concentration of 0.05 to 35 atomic percent, and ideally at a total atomic concentration of 4 to 14 atomic percent. Any suitable dopant may be used that achieves/imparts an etch-stopping effect to silicon nitride as described below. Examples include at least one of carbon, boron, phosphorus, and an elemental-form metal, and including any one of these or any combination of two or more of these. Another lining 88 that is sacrificial (e.g., silicon dioxide or other oxide) may be laterally-inward of etch-stop lining 81. Etch-stop lining 81 and lining 88, when present, may be punch-etched there-through to expose sacrificial material 77 as shown.

In one embodiment, a laterally-outer insulative lining 82 of different composition from that of the doped silicon nitride of etch-stop lining 81 has been formed to extend longitudinally-along immediately-laterally-adjacent memory-block regions 58. Etch-stop lining 81 (when present) is formed after and laterally-inward of laterally-outer insulative lining 82 (when insulative lining 82 is present). Material of insulative lining 82 may be any composition(s) (other than of any of the doped silicon nitride of etch-stop lining 81 when etch-stop lining 81 is present), with ideal examples being one or more insulative oxides such as silicon dioxide, aluminum oxide, and hafnium oxide. By way of example only, insulative lining 82 might be formed as a lining for the sacrificial etch-stop line referred to above (e.g., such a sacrificial line being made of conductive metal material and not shown) and remain after removing such sacrificial line.

Figure 5:
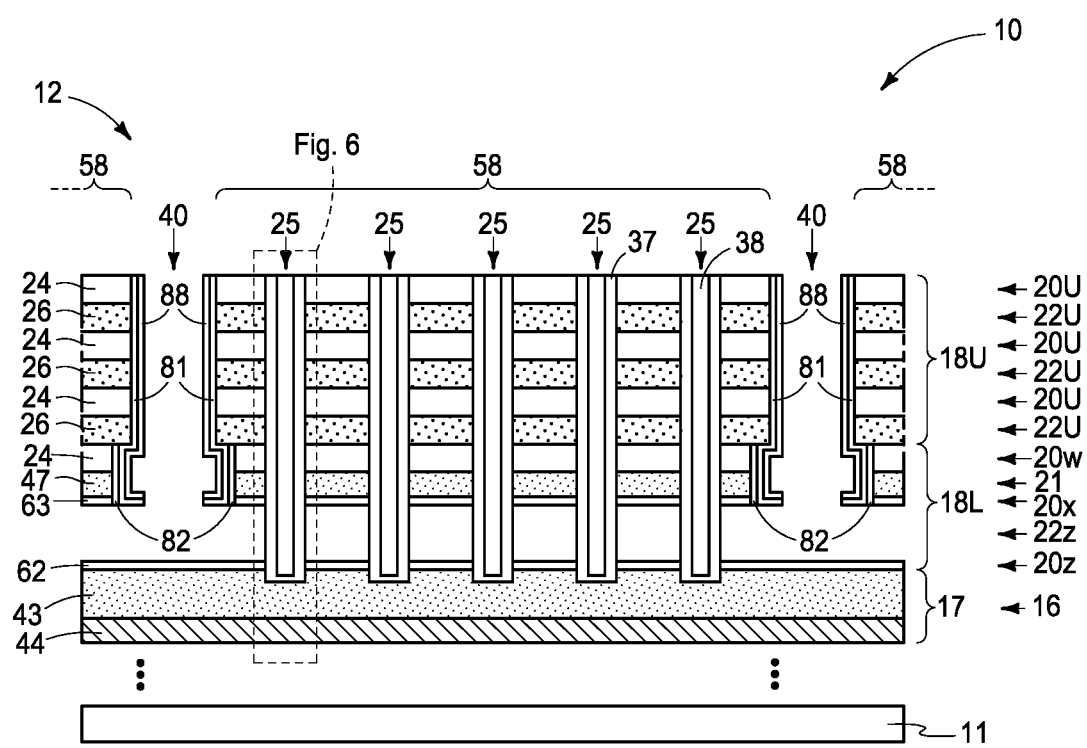
FIGS. 5-28 are diagrammatic sequential sectional, expanded, enlarged, and/or partial views of the construction of FIGS. 1-4, or portions thereof, and/or alternate embodiments in process in accordance with some embodiments of the invention.
Figure 6:
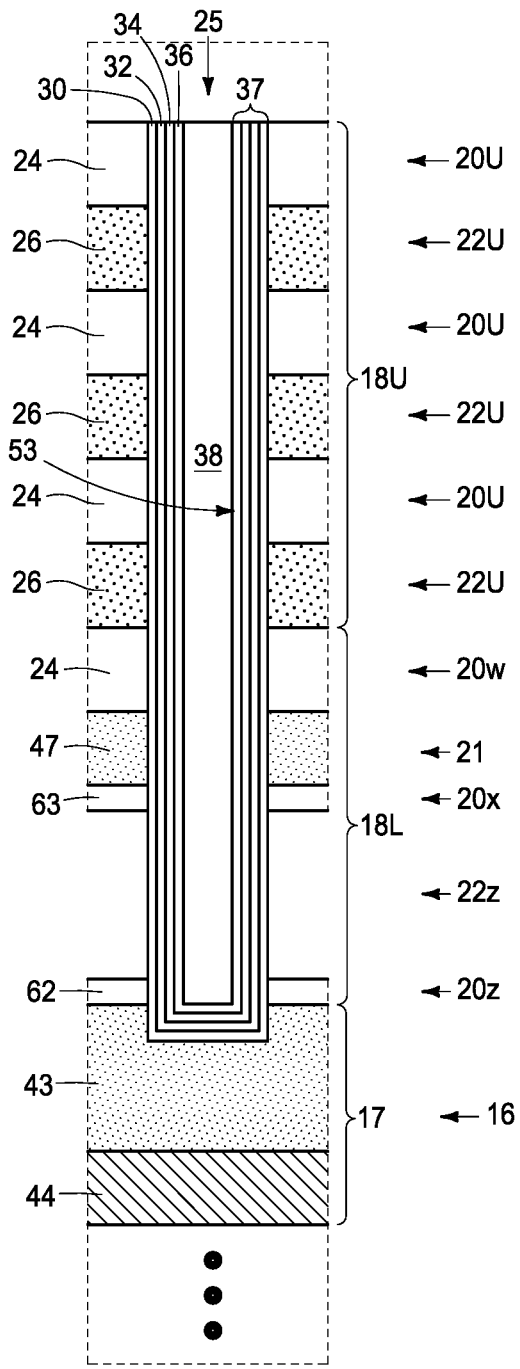

Referring to FIGS. 5 and 6, sacrificial material 77 (not shown) has been removed (e.g., by isotropic etching) from lowest first tier 22z through trenches 40, thus leaving or forming a void-space vertically between lowest second tier 20z and next-lowest second tier 20x. Such may occur, for example, by isotropic etching that is ideally conducted selectively relative to materials 62 and 63, for example using liquid or vapor $H_3PO_4$ as a primary etchant where material 77 is silicon nitride or using tetramethyl ammonium hydroxide [TMAH] where material 77 is polysilicon.

Figure 7:
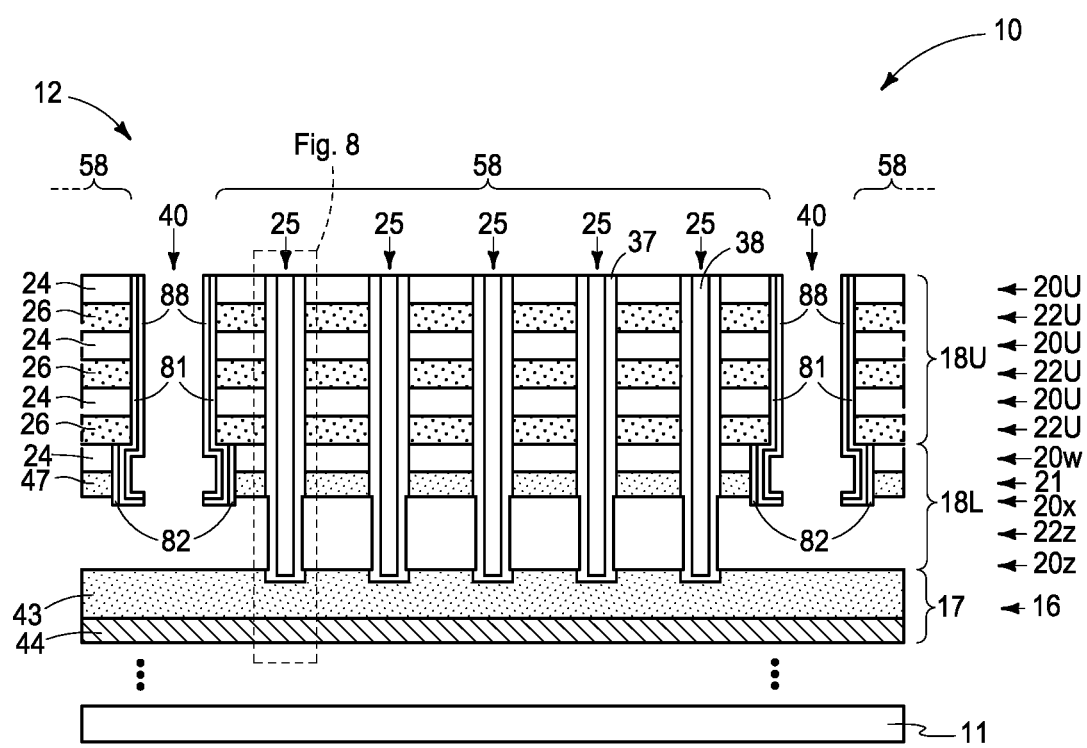
Figure 8:
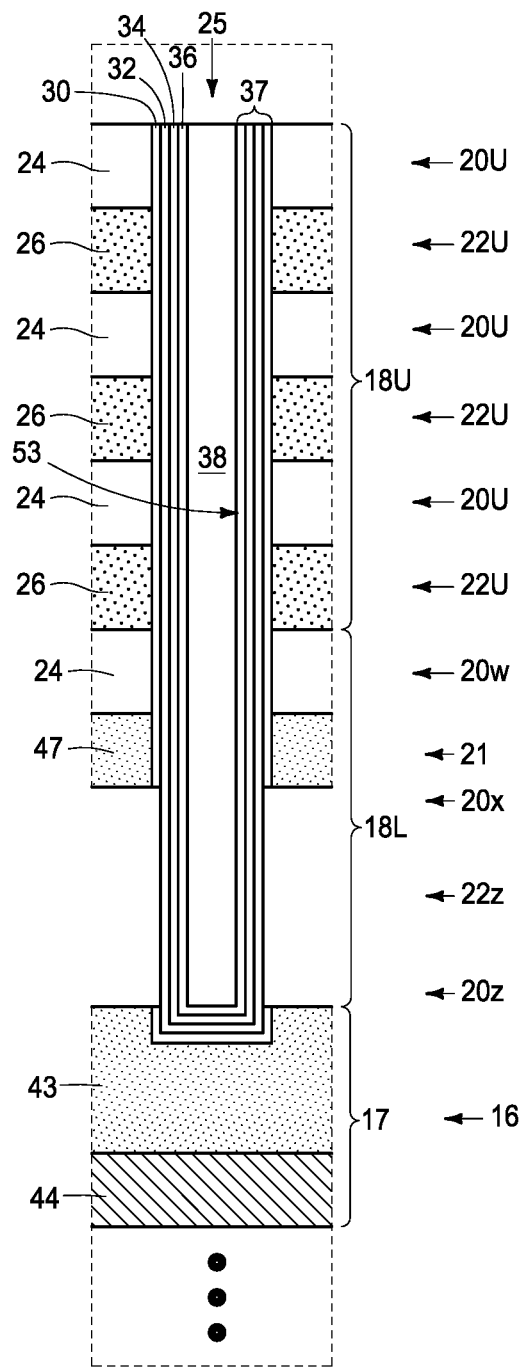

Referring to FIGS. 7 and 8, charge-blocking material 30 (e.g., silicon dioxide) has been etched through trenches 40 to remove it in lowest first tier 22z selectively relative to exposed portions (if any) of doped silicon nitride of etch-stop lining 81 (e.g., by isotropic etching using 100:1 [by volume] water to HF to etch silicon dioxide). Materials 62 and 63 (not shown) may also be removed as shown if such are of the same or similar composition as charge-blocking material 30.

Figure 9:
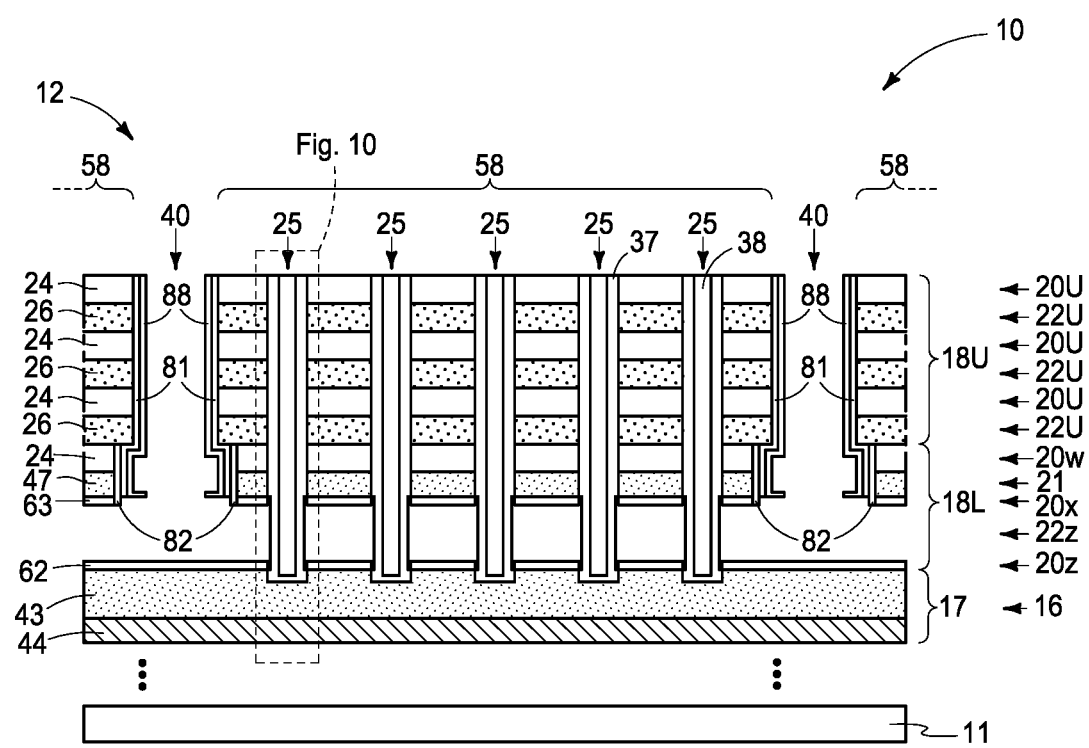
Figure 10:
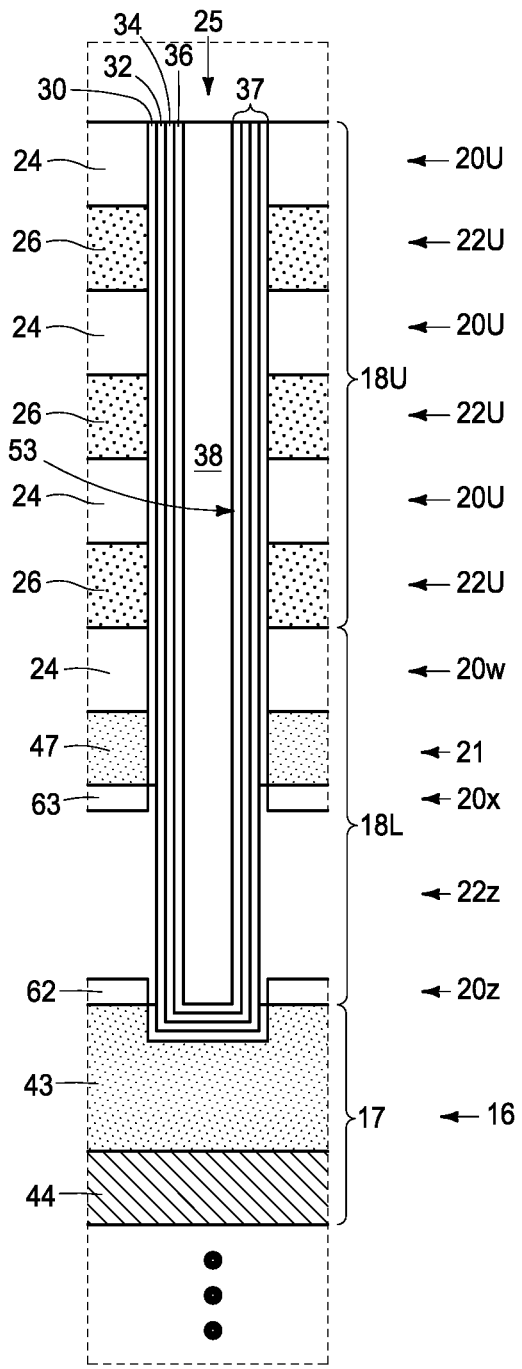

Referring to FIGS. 9 and 10, materials 62 and 63 (e.g., silicon dioxide) have been re-formed (e.g., by oxidizing [with or without plasma] polysilicon materials 47 and 43). Such might be so re-formed to protect materials 47 and 43 from being subsequently undesirably etched when desirably etching other material. In one embodiment, a bottom portion of the doped silicon nitride of etch-stop lining 81, when present, is converted to silicon oxynitride to leave doped silicon nitride there-above. As an example, if etch-stop lining 81 projects downwardly from conducting-material tier 21 (as shown in FIG. 7), such may be converted to silicon oxynitride by plasma exposure to $H_2O$ and $H_2$ at a substrate temperature of 250° C. to 350° C., pressure of 1 mTorr to 100 mTorr, and power at 1,000 W to 4,000 W to substantially drive out the dopant, leaving silicon oxynitride behind. Thereafter, such can be removed (if desired) from projecting below conducting-material 21 by isotropic etching using the above 100:1 water to HF that will also etch silicon oxynitride (such example removing being shown in FIG. 9). Such may occur, when such occurs, before or after re-forming materials 62 and 63.

Figure 11:
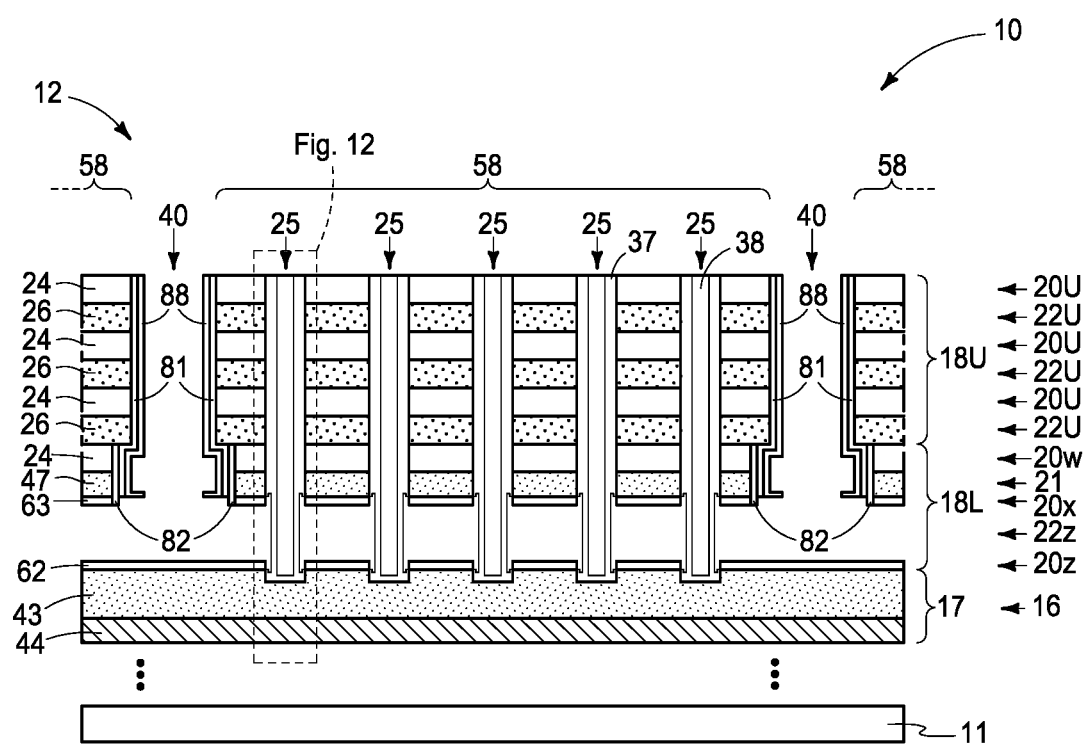
Figure 12:
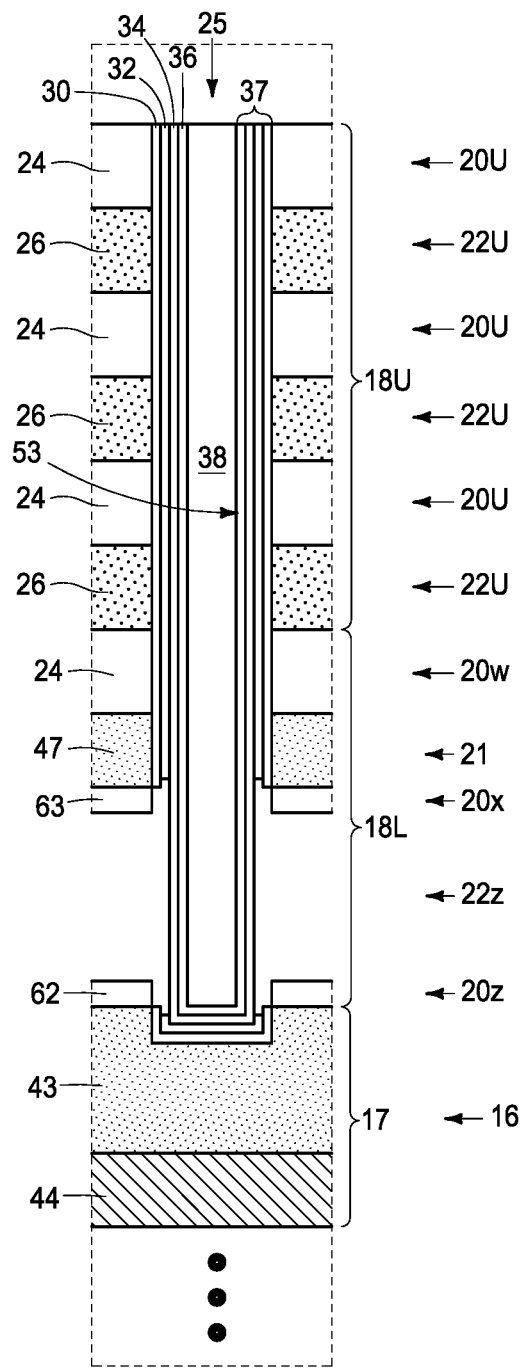

Referring to FIGS. 11 and 12, storage material 32 has been etched through trenches 40 to remove it in lowest first tier 22z selectively relative to exposed portions of doped silicon nitride of etch-stop lining 81. When storage material 32 is silicon nitride and etch-stop lining 81 is doped silicon nitride, an example isotropic etching chemistry is hot phosphoric acid or 1000:1 (by volume) water to HF.

Figure 13:
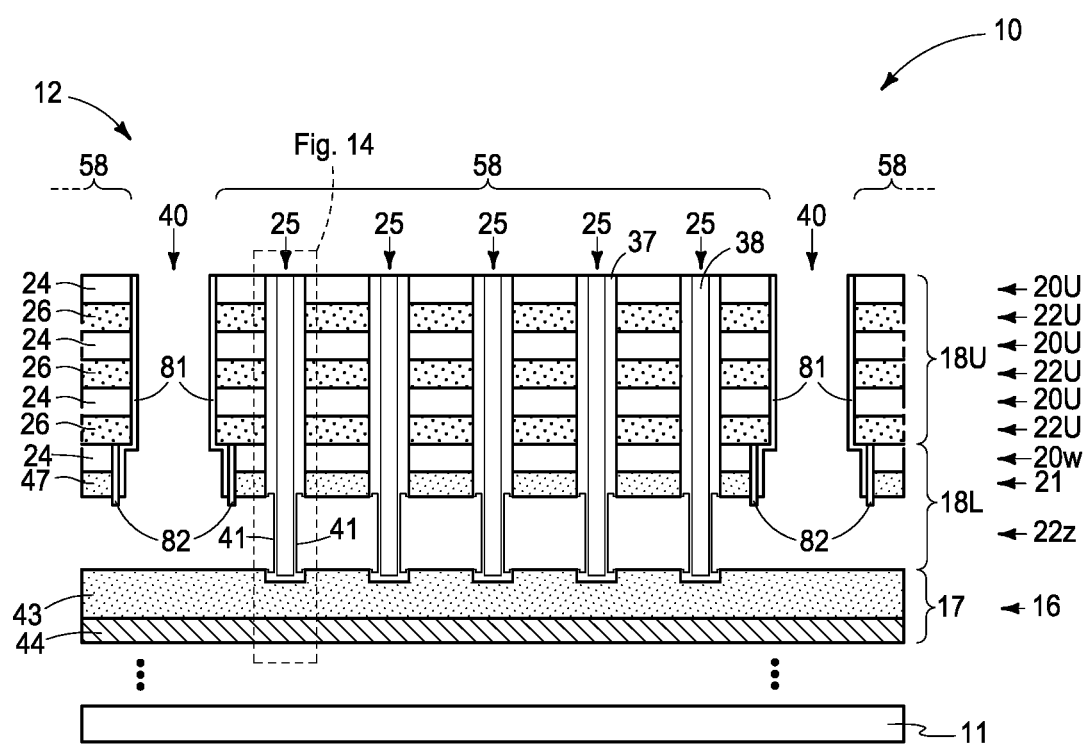
Figure 14:
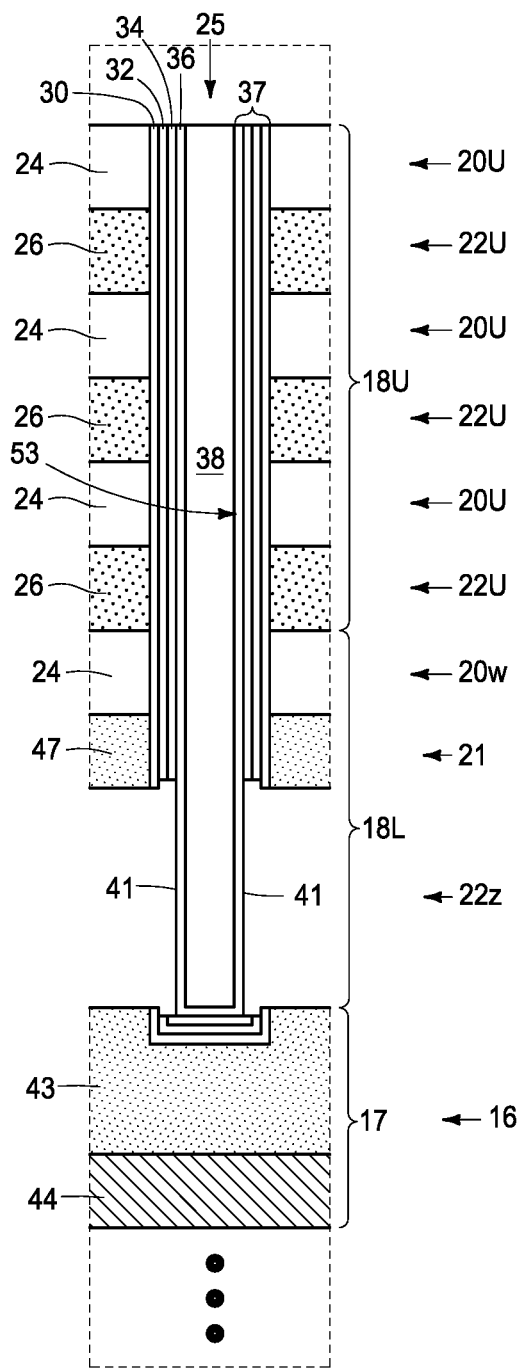

Referring to FIGS. 13 and 14, charge-passage material 34 has been etched through trenches 40 to remove it in lowest first tier 22z selectively relative to exposed portions of doped silicon nitride of etch-stop lining 81. A sidewall 41 of channel material 36 of channel-material strings 53 in lowest first tier 22z has been exposed thereby. The artisan is capable of selecting a suitable isotropic etching chemistry or chemistries to achieve such depending on composition of charge-passage material 34. As an example, charge-passage material 34 may be silicon dioxide, silicon nitride or a composite thereof. Silicon dioxide thereof can be so etched using the above 100:1 water to HF and silicon nitride thereof can be so etched using the above hot phosphoric acid or 1000:1 water to HF. Some of laterally-outer insulative lining 82, when present, may also be etched upwardly when etching charge-passage material 34 (not shown). Lining 88 (not shown), when present, is also shown as having been etched away in FIG. 13. Such may occur before, during, or after the etching of charge-passage material 34.

FIGS. 7-14 as shown and described above are but examples of, through horizontally-elongated trenches 40, etching material (e.g., 30, 32, and/or 34) in the lowest first tier (e.g., 22z) that is laterally-outward of channel material 36 of channel-material strings 53 selectively relative to exposed portions of doped silicon nitride of etch-stop lining 81.

Figure 15:
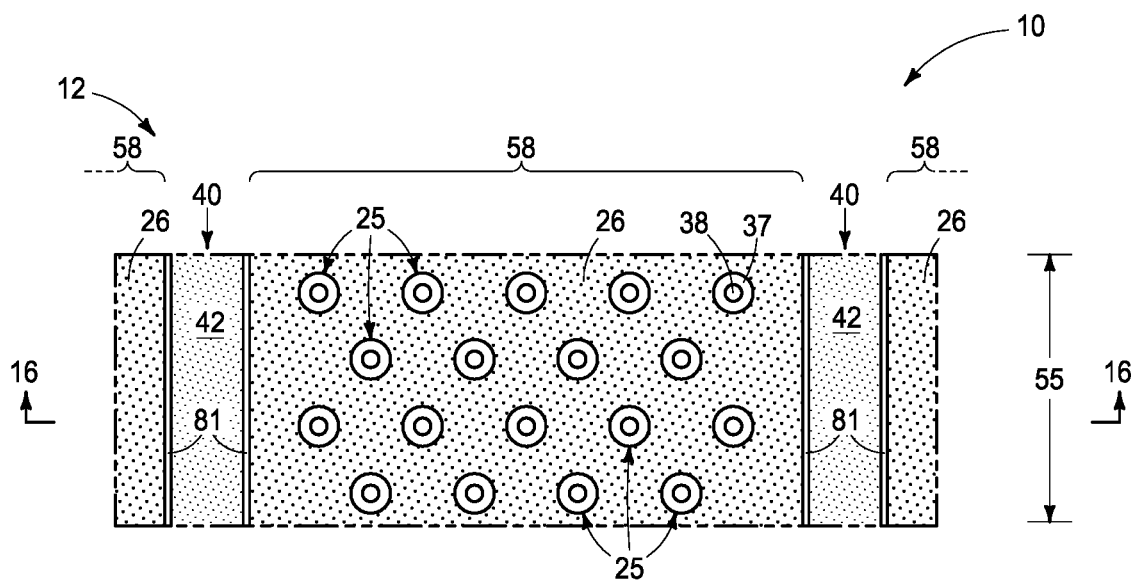
Figure 16:
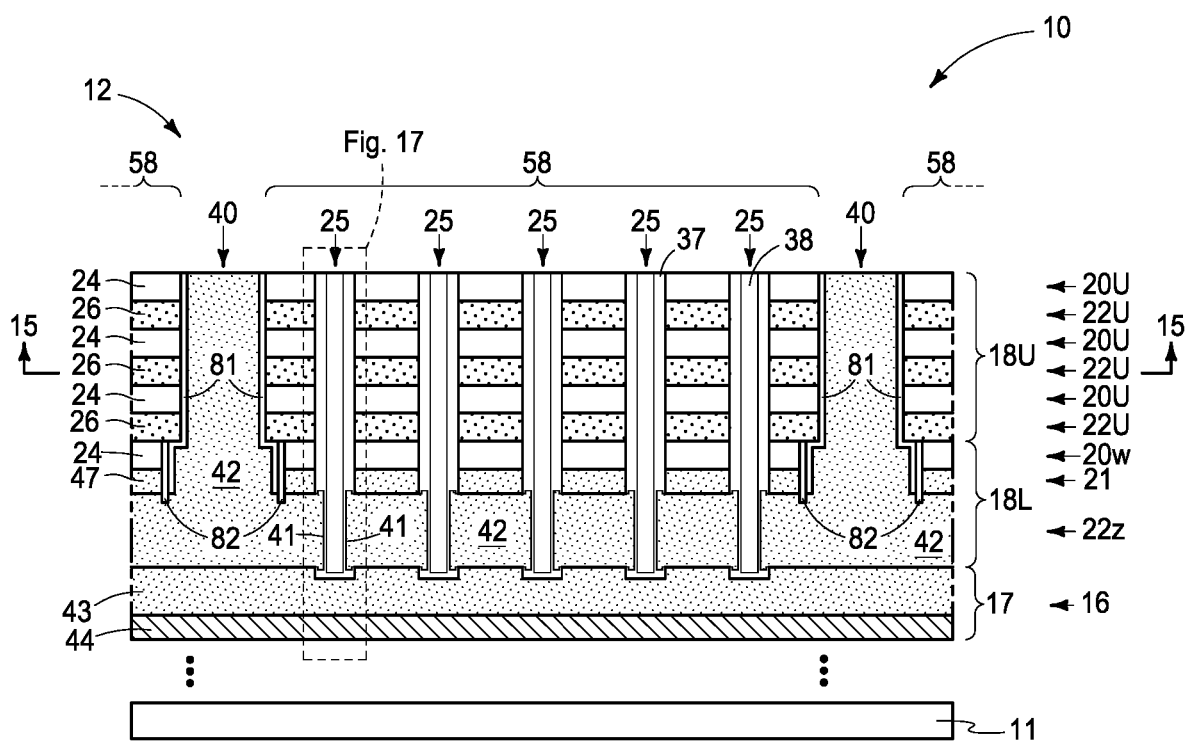
Figure 17:
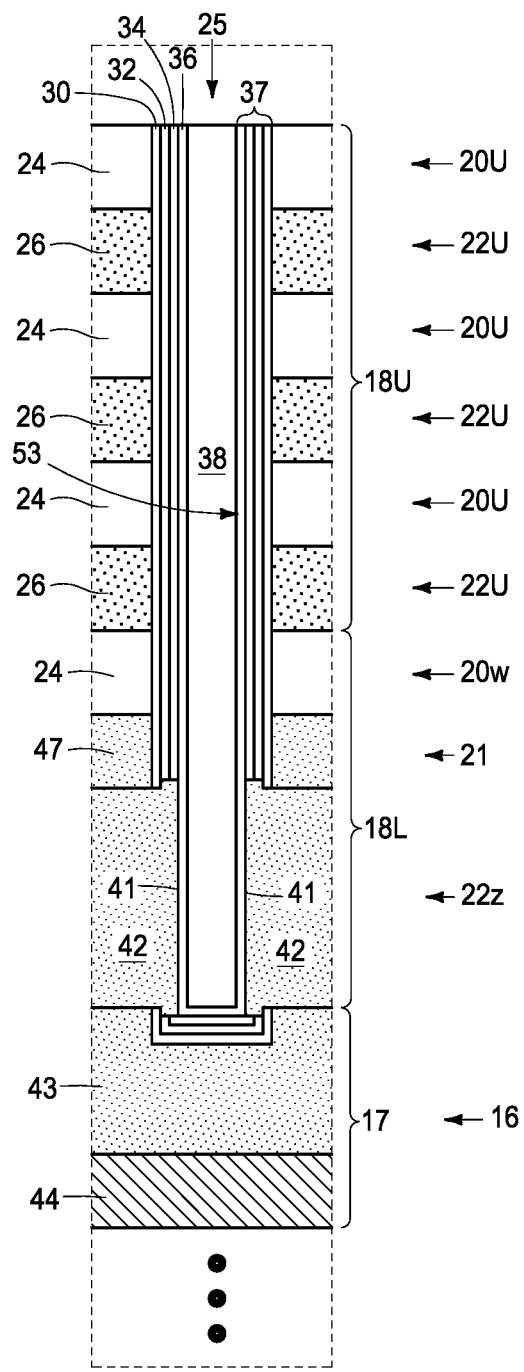

Referring to FIGS. 15-17, conducting material 42 (e.g., conductively-doped polysilicon) has been formed in lowest first tier 22z and in one embodiment directly against sidewall 41 of channel material 36. In one embodiment and as shown, such has been formed directly against a bottom of conducting material 47 of conducting-material tier 21 and directly against a top of conductor material 43 of conductor tier 16, thereby directly electrically coupling together channel material 36 of individual channel-material strings 53 with conductor material 43 of conductor tier 16 and conducting material 47 of conducting-material tier 21. Regardless, conducting material 42 may fill all across trenches 40 (as shown) or may not so-fill (not shown) depending on width of trenches 40 compared to height of the void space between materials 43 and 47 and time of deposition of conducting material 42. Regardless, in one embodiment and as shown, conducting material 42 has been formed laterally-over (e.g., directly against) etch-stop lining 81 that comprises the doped silicon nitride. Conducting material 47 of tier 21 and conducting material 42 of tier 22z being directly against one another may collectively be considered as the lowest conductive tier/lowest first tier that is directly above conductor tier 16.

Figure 18:
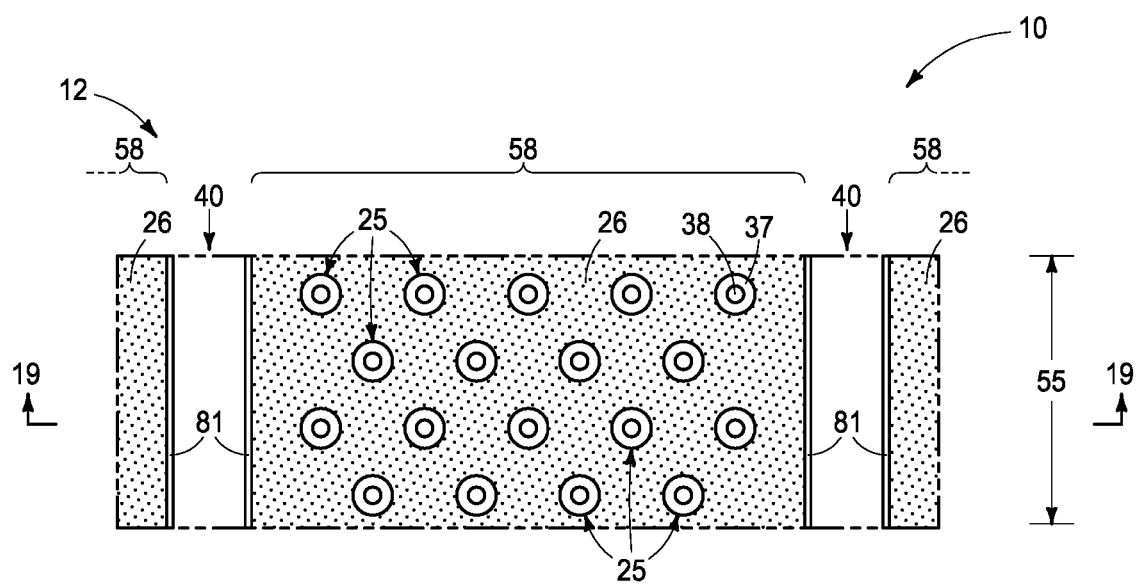
Figure 19:
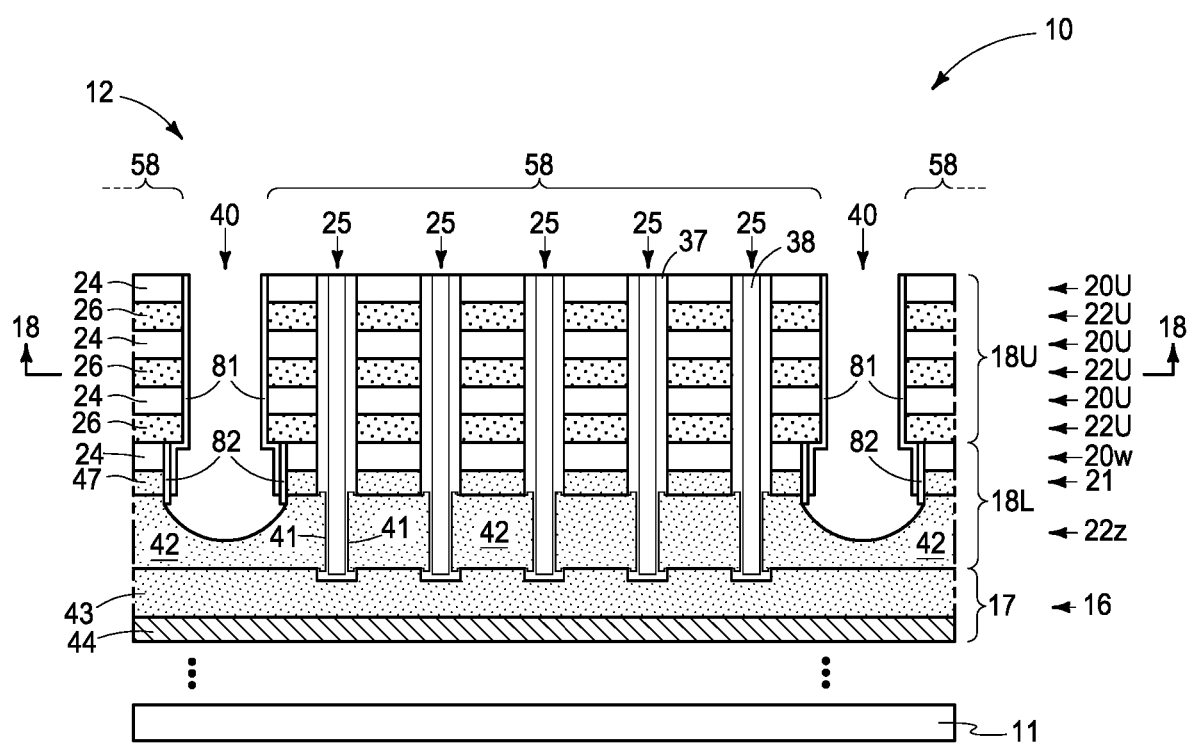

Referring to FIGS. 18 and 19, conducting material 42 has been removed from trenches 40 downwardly into (at least into) lowest first tier 22z (lowest first tier 21/22z) (e.g., using TMAH).

Figure 20:
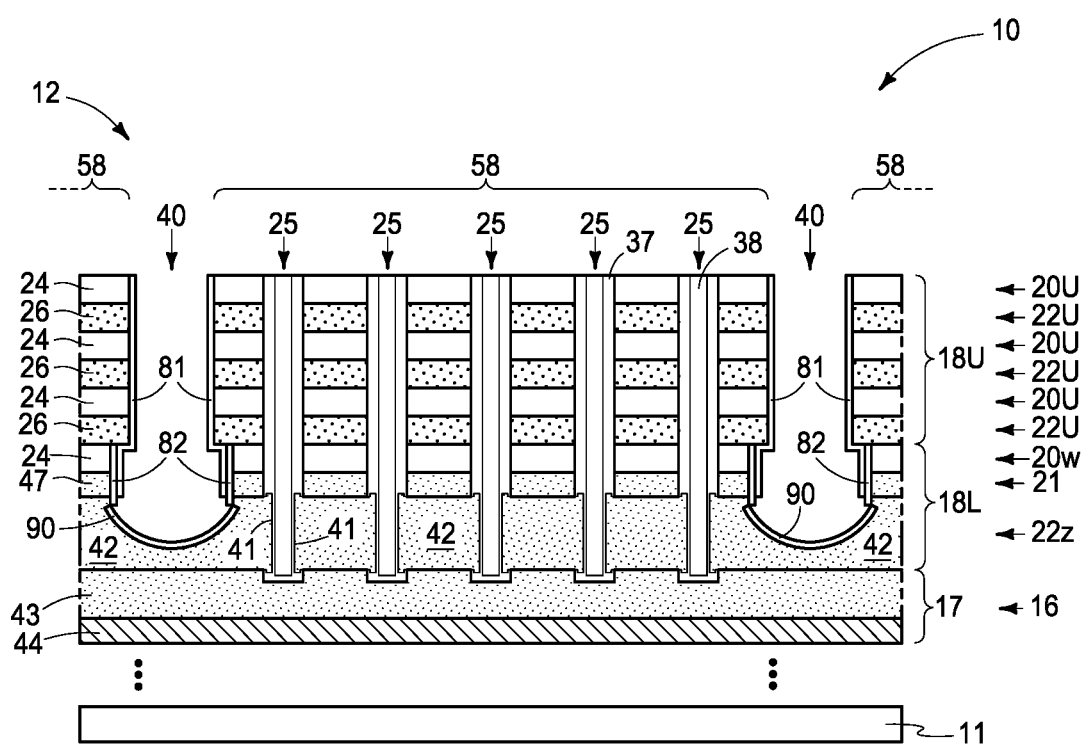

Referring to FIG. 20, an optional etch-stop lining 90 has been formed over exposed conducting material 42. By way of example, such may comprise elemental tungsten that will form by suitable exposure of example polysilicon of conducting material 42 to $WF_6$. The surface of conducting material 42 may be exposed to HF and/or $N_2$ prior to exposure to $WF_6$ to provide a clean polysilicon surface onto which the elemental tungsten is formed.

Figure 21:
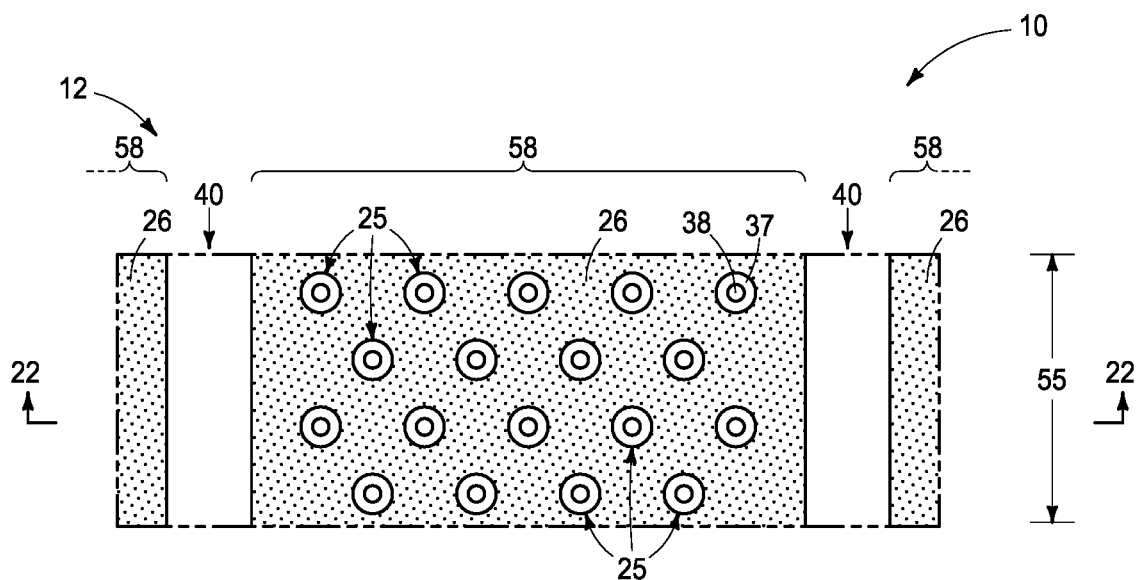
Figure 22:
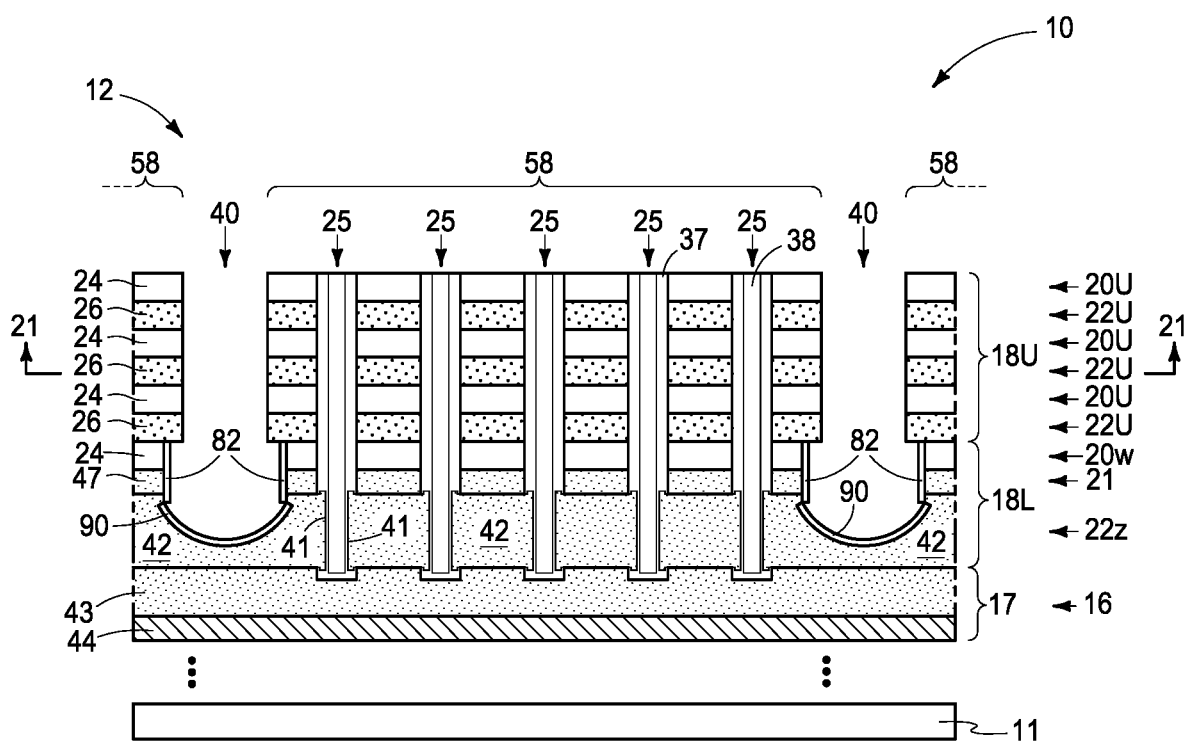
Figure 23:
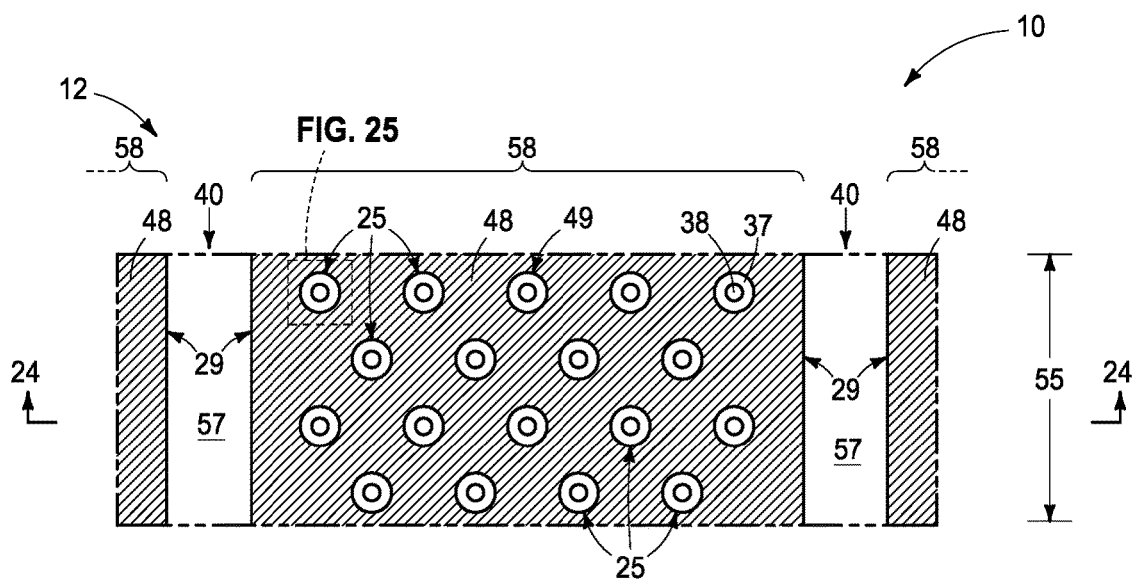
Figure 24:
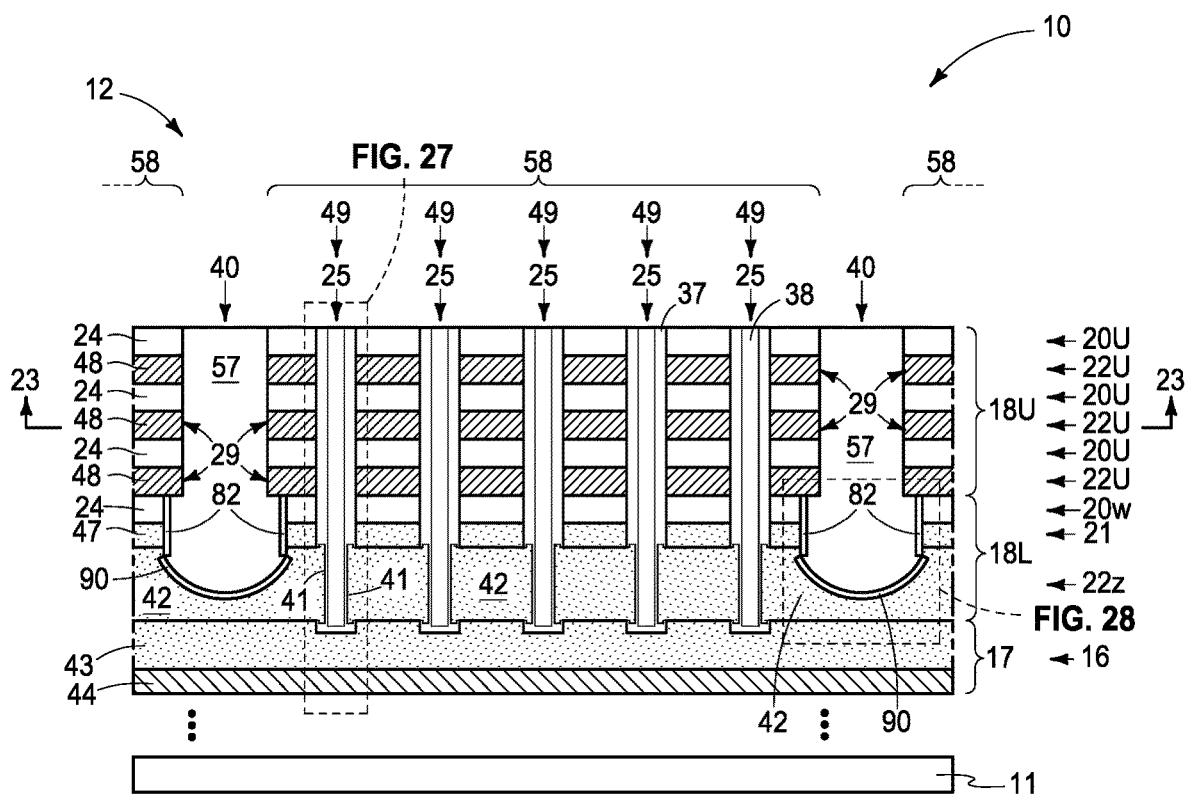
Figure 25:
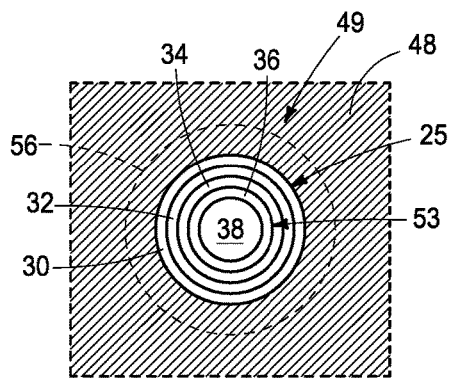
Figure 26:
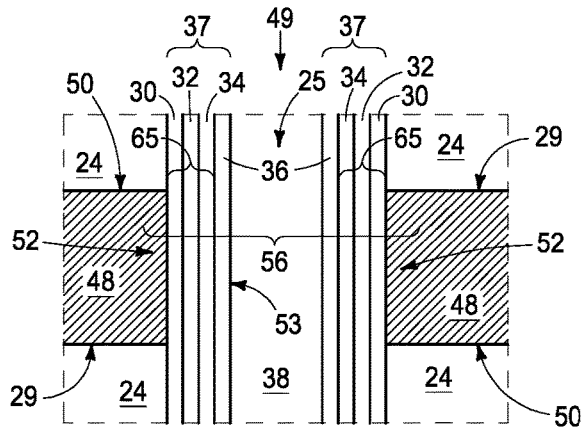
Figure 27:
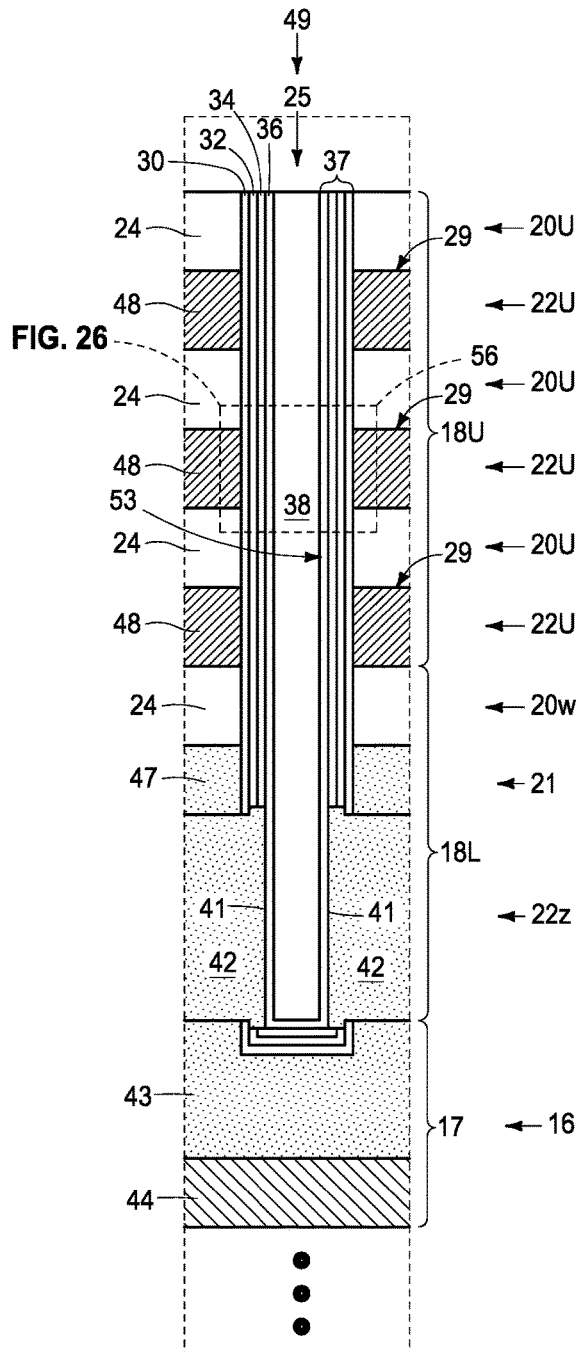

In one embodiment, all of etch-stop lining 81 comprising the doped silicon nitride (when present) is removed after the example etching shown by FIGS. 7-14. In one such embodiment, such removing occurs after forming conducting material 42 laterally-over etch-stop lining 81, for example as shown in FIGS. 21 and 22 (no etch-stop lining 81 being there-shown). By way of example only and in one embodiment, such removing comprises removing the dopant from the doped silicon nitride to form a silicon oxynitride-comprising lining in trenches 40, followed by etching all of the silicon oxynitride-comprising lining from the horizontally-elongated trenches. More specifically in such example, and by way of example only, the structure of FIGS. 18 and 19 can be exposed to plasma $H_2O$ and $H_2$ at a substrate temperature of 250° C. to 350° C., pressure of 1 mTorr to 100 mTorr, and power of 1,000 W to 4,000 W to convert to silicon oxynitride. The processing of FIG. 20 can then occur, followed by using the above 100:1 water to HF solution to remove such silicon oxynitride as shown by FIGS. 21 and 22.

Referring to FIGS. 23-28, material 26 (not shown) of first tiers 22 has been removed, for example by being isotropically etched away through trenches 40 ideally selectively relative to the other exposed materials (e.g., using liquid or vapor $H_3PO_4$ as a primary etchant where material 26 is silicon nitride and other materials comprise one or more oxides or polysilicon). Material 26 (not shown) in conductive tiers 22 in the example embodiment is sacrificial and has been replaced with conducting material 48, and which has thereafter been removed from trenches 40, thus forming individual conductive lines 29 (e.g., wordlines in stack 18) and elevationally-extending strings 49 of individual transistors and/or memory cells 56 in stack 18. Optional etch-stop lining 90 may be used to restrict etching of conducting material 42 from being etched by the etching chemistry that etches material 26 (material 26 not being shown).

A thin insulative liner (e.g., $Al_2O_3$ and not shown) may be formed before forming conducting material 48. Approximate locations of transistors and/or memory cells 56 are indicated with a bracket in some figures and some with dashed outlines in some figures, with transistors and/or memory cells 56 being essentially ring-like or annular in the depicted example. Alternately, transistors and/or memory cells 56 may not be completely encircling relative to individual channel openings 25 such that each channel opening 25 may have two or more elevationally-extending strings 49 (e.g., multiple transistors and/or memory cells about individual channel openings in individual conductive tiers with perhaps multiple wordlines per channel opening in individual conductive tiers, and not shown). Conducting material 48 may be considered as having terminal ends 50 corresponding to control-gate regions 52 of individual transistors and/or memory cells 56. Control-gate regions 52 in the depicted embodiment comprise individual portions of individual conductive lines 29. Materials 30, 32, and 34 may be considered as a memory structure 65 that is laterally between control-gate region 52 and channel material 36. In one embodiment and as shown with respect to the example "gate-last" processing, conducting material 48 of conductive tiers 22 is formed after forming channel openings 25 and/or trenches 40. Alternately, the conducting material of the conductive tiers may be formed before forming channel openings 25 and/or trenches 40 (not shown), for example with respect to "gate-first" processing.

A charge-blocking region (e.g., charge-blocking material 30) is between storage material 32 and individual control-gate regions 52. A charge block may have the following functions in a memory cell: In a program mode, the charge block may prevent charge carriers from passing out of the storage material (e.g., floating-gate material, charge-trapping material, etc.) toward the control gate, and in an erase mode the charge block may prevent charge carriers from flowing into the storage material from the control gate. Accordingly, a charge block may function to block charge migration between the control-gate region and the storage material of individual memory cells. An example charge-blocking region as shown comprises insulator material 30. By way of further examples, a charge-blocking region may comprise a laterally (e.g., radially) outer portion of the storage material (e.g., material 32) where such storage material is insulative (e.g., in the absence of any different-composition material between an insulative storage material 32 and conducting material 48). Regardless, as an additional example, an interface of a storage material and conductive material of a control gate may be sufficient to function as a charge-blocking region in the absence of any separate-composition-insulator material 30. Further, an interface of conducting material 48 with material 30 (when present) in combination with insulator material 30 may together function as a charge-blocking region, and as alternately or additionally may a laterally-outer region of an insulative storage material (e.g., a silicon nitride material 32). An example material 30 is one or more of silicon hafnium oxide and silicon dioxide.

Intervening material (e.g., 57) has been formed in trenches 40 and thereby laterally-between and longitudinally-along immediately-laterally-adjacent memory blocks 58. The intervening material may provide lateral electrical isolation (insulation) between immediately-laterally-adjacent memory blocks. Such may include one or more of insulative, semiconductive, and conducting materials and, regardless, may facilitate conductive tiers 22 from shorting relative one another in a finished-circuitry construction. Example insulative materials are one or more of $SiO_2$, $Si_3N_4$, and $Al_2O_3$. The intervening material may include through-array vias (not shown).

Figure 28:
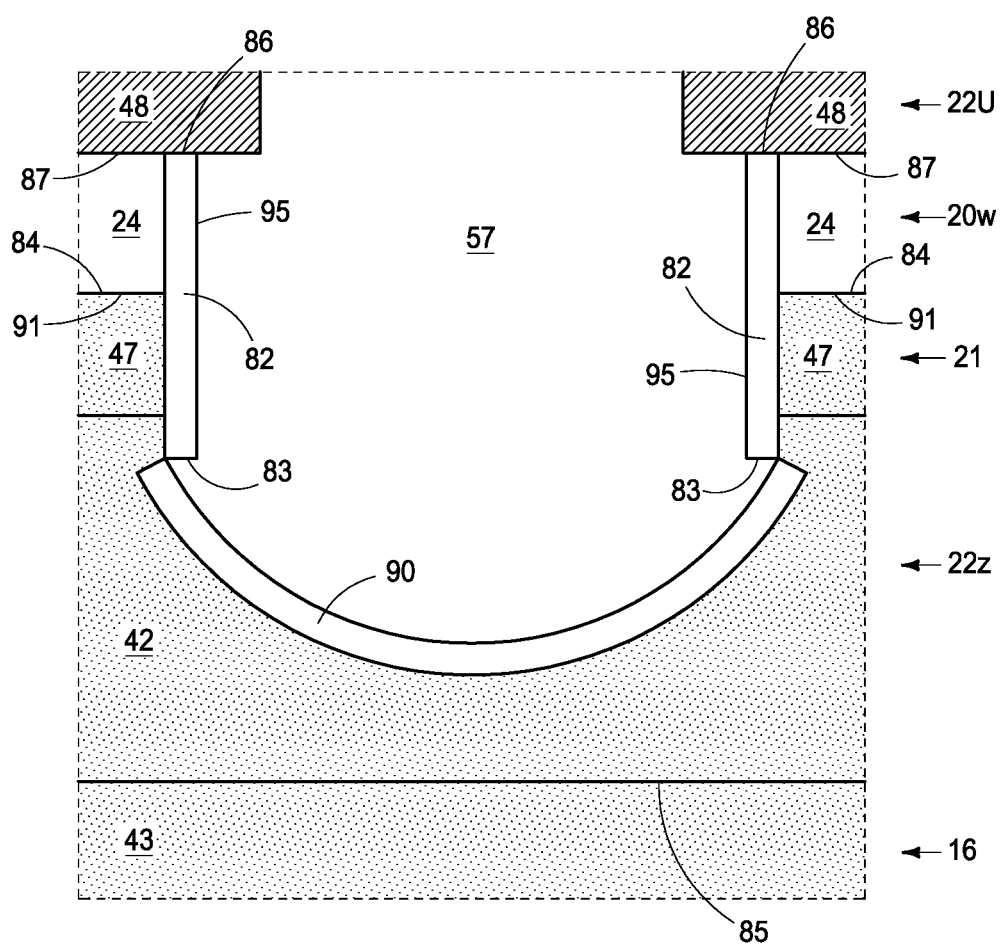

In one embodiment, laterally-outer insulative lining 82 has its lowest surface 83 in a finished-circuitry construction between a top 84 and a bottom 85 of lowest first tier 22z (21/22z) and has its highest surface 86 at or below a lowest surface 87 of the next-lowest first tier (e.g., 22U) in the finished-circuitry construction (FIG. 28). In one embodiment, highest surface 86 of laterally-outer insulative lining 82 is above a lowest surface 91 of the lowest second tier in the finished-circuitry construction (e.g., now 20w). In one embodiment and as shown, highest surface 86 of the laterally-outer insulative lining 82 is at (elevationally coincident with) lowest surface 87 of the next-lowest first tier in the finished-circuitry construction, and in one such embodiment laterally-outer insulative lining 82 is homogenous.

Any other attribute(s) or aspect(s) as shown and/or described herein with respect to other embodiments may be used in the embodiments shown and described with reference to the above embodiments.

In one embodiment, a method used in forming memory circuitry (e.g., 10) comprises forming a stack (e.g., 18*) comprising vertically-alternating first tiers (e.g., 22) and second tiers (e.g., 20) directly above a conductor tier (e.g., 16). The stack comprises laterally-spaced memory-block regions (e.g., 58). Channel-material strings (e.g., 53) are formed and that extend through the first and second tiers in the memory-block regions. The channel-material strings directly electrically couple to conductor material (e.g., 17) of the conductor tier at least in a finished-circuitry construction. Intervening material (e.g., 57 and 82 in combination) is formed laterally-between and longitudinally-along immediately-laterally-adjacent of the memory-block regions. The intervening material in the finished-circuitry construction comprises a laterally-outer insulative lining (e.g., 82) extending longitudinally-along the immediately-laterally-adjacent memory-block regions. The laterally-outer insulative lining has its lowest surface (e.g., 83) between a top (e.g., 84) and a bottom (e.g., 85) of the lowest first tier (e.g., 22z; e.g., 21/22z) in the finished-circuitry construction. The laterally-outer insulative lining has its highest surface (e.g., 86) at or below a lowest surface (e.g., 87) of the next-lowest first tier (e.g., 22U in FIG. 28) in the finished-circuitry construction. The intervening material comprises laterally-inner insulating material (e.g., 57) extending longitudinally-along the immediately-laterally-adjacent memory-block regions laterally-inward of the laterally-outer insulative lining. An interface (e.g., 95) is between the laterally-outer insulative lining and the laterally-inner insulating material. The interface may be continuous or discontinuous at some place(s) there-along. The interface will be continuous when the laterally-outer insulative lining and the laterally-inner insulating material are of different compositions relative one another. The interface may or may not be continuous when the laterally-outer insulative lining and the laterally-inner insulating material are of the same composition relative one another. For example, separate-in-time formed laterally-outer insulative lining and laterally-inner insulating material of the same composition relative one another may nevertheless have a perceptible interface in a finished construction. Some of that interface may effectively disappear (i.e., not be perceptible) and some may remain perceptible whereby that interface is discontinuous in one or more locations longitudinally-there-along (e.g., as may occur by welding of the same-composition materials together due to subsequent heating during manufacture). In one embodiment, the laterally-outer insulative lining and the laterally-inner insulating material are of different compositions relative one another and in another embodiment are of the same composition relative one another. Any other attribute(s) or aspect(s) as shown and/or described herein with respect to other embodiments may be used.

Alternate embodiment constructions may result from method embodiments described above, or otherwise. Regardless, embodiments of the invention encompass memory arrays independent of method of manufacture. Nevertheless, such memory arrays may have any of the attributes as described herein in method embodiments. Likewise, the above-described method embodiments may incorporate, form, and/or have any of the attributes described with respect to device embodiments.

In one embodiment, a memory array (e.g., 12) comprising strings (e.g., 49) of memory cells (e.g., 56) comprises laterally-spaced memory blocks (e.g., 58) individually comprising a vertical stack (e.g., 18*) comprising alternating insulative tiers (e.g., 20) and conductive tiers (e.g., 22) above a conductor tier (e.g., 16). The strings of memory cells comprise channel-material strings (e.g., 53) that extend through the insulative tiers and the conductive tiers in the memory blocks. The channel-material strings directly electrically couple to conductor material (e.g., 17) of the conductor tier. Intervening material (e.g., 57 and 82 in combination) is laterally-between and longitudinally-along immediately-laterally-adjacent of the memory blocks. The intervening material comprises a laterally-outer insulative lining (e.g., 82) extending longitudinally-along the immediately-laterally-adjacent memory-blocks. The laterally-outer insulative lining has its lowest surface (e.g., 83) between a top (e.g., 84) and a bottom (e.g., 85) of the lowest conductive tier (e.g., 22z, 21/22z). The laterally-outer insulative lining has its highest surface (e.g., 86) at or below a lowest surface (e.g., 87) of the next-lowest conductive tier (e.g., 22U in FIG. 28). The intervening material comprises laterally-inner insulating material (e.g., 57) extending longitudinally-along the immediately-laterally-adjacent memory blocks laterally-inward of the laterally-outer insulative lining. An interface (e.g., 95) is between the laterally-outer insulative lining and the laterally-inner insulating material. Any other attribute(s) or aspect(s) as shown and/or described herein with respect to other embodiments may be used.

A predecessor method formed lining 81 as undoped silicon nitride that could be etched upwardly to an adverse degree when etching a storage material 32 that also is undoped silicon nitride to expose channel-material string 53.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles (i.e., other than the straight angle).

The composition of any of the conductive/conductor/conducting materials herein may be conductive metal material and/or conductively-doped semiconductive/semiconductor/semiconducting material. "Metal material" is any one or combination of an elemental metal, any mixture or alloy of two or more elemental metals, and any one or more metallic compound(s).

Herein, any use of "selective" as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a method used in forming memory circuitry comprises forming a stack comprising vertically-alternating first tiers and second tiers directly above a conductor tier. The stack comprises laterally-spaced memory-block regions. Channel-material strings are formed that extend through the first and second tiers in the memory-block regions. The channel-material strings directly electrically couple to conductor material of the conductor tier at least in a finished-circuitry construction. Intervening material is formed laterally-between and longitudinally-along immediately-laterally-adjacent of the memory-block regions. The intervening material in the finished-circuitry construction comprises a laterally-outer insulative lining extending longitudinally-along the immediately-laterally-adjacent memory-block regions. The laterally-outer insulative lining has its lowest surface between a top and a bottom of the lowest first tier in the finished-circuitry construction. The laterally-outer insulative lining has its highest surface at or below a lowest surface of the next-lowest first tier in the finished-circuitry construction. Laterally-inner insulating material extends longitudinally-along the immediately-laterally-adjacent memory-block regions laterally-inward of the laterally-outer insulative lining. An interface is between the laterally-outer insulative lining and the laterally-inner insulating material.

In some embodiments, a method used in forming memory circuitry comprises forming a stack comprising vertically-alternating first tiers and second tiers directly above a conductor tier. The stack comprises horizontally-elongated trenches extending through the first tiers and the second tiers and that are individually between immediately-laterally-adjacent memory-block regions. Channel-material strings are formed that extend through the first and second tiers in the memory-block regions. An etch-stop lining is formed in the horizontally-elongated trenches that extends longitudinally-along the immediately-laterally-adjacent memory-block regions. The etch-stop lining comprises a doped silicon nitride having dopant therein at a total atomic concentration of 0.05 to 35 atomic percent. Through the horizontally-elongated trenches, material in the lowest first tier that is laterally-outward of the channel material of the channel-material strings is etched selectively relative to exposed portions of the doped silicon nitride of the etch-stop lining. After the etching and through the horizontally-elongated trenches, conducting material is formed in the lowest first tier that directly electrically couples together the channel material of the channel-material strings and conductor material of the conductor tier.

In some embodiments, a memory array comprising strings of memory cells comprises laterally-spaced memory blocks individually comprising a vertical stack comprising alternating insulative tiers and conductive tiers above a conductor tier. Strings of memory cells comprise channel-material strings that extend through the insulative tiers and the conductive tiers in the memory blocks. The channel-material strings directly electrically couple to conductor material of the conductor tier. Intervening material is laterally-between and longitudinally-along immediately-laterally-adjacent of the memory blocks. The intervening material comprises a laterally-outer insulative lining extending longitudinally-along the immediately-laterally-adjacent memory-blocks. The laterally-outer insulative lining has its lowest surface between a top and a bottom of the lowest conductive tier. The laterally-outer insulative lining has its highest surface at or below a lowest surface of the next-lowest conductive tier. Laterally-inner insulating material extends longitudinally-along the immediately-laterally-adjacent memory blocks laterally-inward of the laterally-outer insulative lining. An interface is between the laterally-outer insulative lining and the laterally-inner insulating material.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method used in forming memory circuitry, comprising:

forming a stack comprising vertically-alternating first tiers and second tiers directly above a conductor tier, the stack comprising laterally-spaced memory-block regions;

forming channel-material strings that extend through the first and second tiers in the memory-block regions, the channel-material strings directly electrically coupling to conductor material of the conductor tier at least in a finished-circuitry construction; and forming intervening material laterally-between and longitudinally-along immediately-laterally-adjacent of the memory-block regions, the intervening material in the finished-circuitry construction comprising:
 a laterally-outer insulative lining extending longitudinally-along the immediately-laterally-adjacent memory-block regions, the laterally-outer insulative lining having its lowest surface between a top and a bottom of the lowest first tier in the finished-circuitry construction, the laterally-outer insulative lining having its highest surface at or below a lowest surface of the next-lowest first tier in the finished-circuitry construction;
 laterally-inner insulating material extending the immediately-laterally-adjacent longitudinally-along memory-block regions laterally-inward of the laterally-outer insulative lining; and
 an interface between the laterally-outer insulative lining and the laterally-inner insulating material.

2. The method of claim 1 wherein the highest surface of the laterally-outer insulative lining is above a lowest surface of the lowest second tier in the finished-circuitry construction.

3. The method of claim 1 wherein the highest surface of the laterally-outer insulative lining is at the lowest surface of the next-lowest first tier in the finished-circuitry construction.

4. The method of claim 3 wherein the laterally-outer insulative lining is homogenous.

5. The method of claim 1 wherein the laterally-outer insulative lining and the laterally-inner insulating material are of different compositions relative one another.

6. The method of claim 1 wherein the laterally-outer insulative lining and the laterally-inner insulating material are of the same composition relative one another.

7. A method used in forming memory circuitry, comprising:
 forming a stack comprising vertically-alternating first tiers and second tiers directly above a conductor tier, the stack comprising horizontally-elongated trenches extending through the first tiers and the second tiers and that are individually between immediately-laterally-adjacent memory-block regions;
 forming channel-material strings that extend through the first and second tiers in the memory-block regions;
 forming an etch-stop lining in the horizontally-elongated trenches that extends longitudinally-along the immediately-laterally-adjacent memory-block regions, the etch-stop lining comprising a doped silicon nitride having dopant therein at a total atomic concentration of 0.05 to 35 atomic percent;
 through the horizontally-elongated trenches, etching material in the lowest first tier that is laterally-outward of the channel material of the channel-material strings selectively relative to exposed portions of the doped silicon nitride of the etch-stop lining; and
 after the etching and through the horizontally-elongated trenches, forming conducting material in the lowest first tier that directly electrically couples together the channel material of the channel-material strings and conductor material of the conductor tier.

8. The method of claim 7 wherein total dopant atomic concentration in the doped silicon nitride is 3 to 14 atomic percent.

9. The method of claim 7 wherein the dopant comprises at least one of carbon, boron, phosphorus, and an elemental-form metal.

10. The method of claim 9 wherein the dopant comprises carbon.

11. The method of claim 9 wherein the dopant comprises boron.

12. The method of claim 9 wherein the dopant comprises phosphorus.

13. The method of claim 9 wherein the dopant comprises elemental-form metal.

14. The method of claim 7 comprising removing all of the etch-stop lining comprising the doped silicon nitride after the etching.

15. The method of claim 14 wherein the removing all of the etch-stop lining comprises removing the dopant from the doped silicon nitride to form a silicon oxynitride-comprising lining in the horizontally-elongated trenches.

16. The method of claim 15 comprising etching all of the silicon oxynitride-comprising lining from the horizontally-elongated trenches.

17. The method of claim 7 comprising forming the conducting material laterally-over the etch-stop lining comprising the doped silicon nitride.

18. The method of claim 17 comprising removing all of the etch-stop lining comprising the doped silicon nitride after forming the conducting material laterally-over the etch-stop lining comprising the doped silicon nitride.

19. The method of claim 7 comprising converting only a bottom portion of the doped silicon nitride to silicon oxynitride to leave doped silicon nitride there-above.

20. The method of claim 7 comprising forming a laterally-outer insulative lining of different composition from that of the doped silicon nitride and to extend longitudinally-along the immediately-laterally-adjacent memory-block regions, the etch-stop lining being formed after and laterally-inward of the laterally-outer insulative lining.

21. The method of claim 20 wherein the laterally-outer insulative lining has its lowest surface in a finished-circuitry construction between a top and a bottom of the lowest first tier, the laterally-outer insulative lining having its highest surface at or below a lowest surface of the next-lowest first tier in the finished-circuitry construction.

22. The method of claim 20 wherein the highest surface of the laterally-outer insulative lining is above a lowest surface of the lowest second tier in the finished-circuitry construction.

23. The method of claim 20 wherein the highest surface of the laterally-outer insulative lining is at the lowest surface of the next-lowest first tier in the finished-circuitry construction.

24. The method of claim 23 wherein the laterally-outer insulative lining is homogenous.

25. A memory array comprising strings of memory cells, comprising:
 laterally-spaced memory blocks individually comprising a vertical stack comprising alternating insulative tiers and conductive tiers above a conductor tier, strings of memory cells comprising channel-material strings that extend through the insulative tiers and the conductive tiers in the memory blocks, the channel-material strings directly electrically coupling to conductor material of the conductor tier; and intervening material laterally-between and longitudinally-along immediately-laterally-adjacent of the memory blocks, the intervening material comprising:
- a laterally-outer insulative lining extending longitudinally-along the immediately-laterally-adjacent memory-blocks, the laterally-outer insulative lining having its lowest surface between a top and a bottom of the lowest conductive tier, the laterally-outer insulative lining having its highest surface at or below a lowest surface of the next-lowest conductive tier;
- laterally-inner insulating material extending longitudinally-along the immediately-laterally-adjacent memory blocks laterally-inward of the laterally-outer insulative lining; and
- an interface between the laterally-outer insulative lining and the laterally-inner insulating material.

26. The memory array of claim 25 wherein the highest surface of the laterally-outer insulative lining is above a lowest surface of the lowest second tier.

27. The memory array of claim 25 wherein the highest surface of the laterally-outer insulative lining is at the lowest surface of the next-lowest first tier.

28. The memory array of claim 27 wherein the laterally-outer insulative lining is homogenous.

29. The memory array of claim 25 wherein the laterally-outer insulative lining and the laterally-inner insulating material are of different compositions relative one another.

30. The memory array of claim 29 wherein the highest surface of the laterally-outer insulative lining is above a lowest surface of the lowest second tier.

31. The memory array of claim 29 wherein the highest surface of the laterally-outer insulative lining is at the lowest surface of the next-lowest first tier.

32. The memory array of claim 31 wherein the laterally-outer insulative lining is homogenous.

33. The memory array of claim 25 wherein the laterally-outer insulative lining and the laterally-inner insulating material are of the same composition relative one another.

34. The memory array of claim 33 wherein the highest surface of the laterally-outer insulative lining is above a lowest surface of the lowest second tier.

35. The memory array of claim 33 wherein the highest surface of the laterally-outer insulative lining is at the lowest surface of the next-lowest first tier.

36. The memory array of claim 35 wherein the laterally-outer insulative lining is homogenous.

* * * * *